(12) United States Patent
Ahn et al.

(10) Patent No.: US 7,918,910 B2
(45) Date of Patent: Apr. 5, 2011

(54) UNIT FOR ELIMINATING PARTICLES AND APPARATUS FOR TRANSFERRING A SUBSTRATE HAVING THE SAME

(75) Inventors: Young-Ki Ahn, Icheon-si (KR); Jae-Jeong Jeong, Cheonan-si (KR); Bo-Ram-Chan Sung, Asan-si (KR); Kyo-Woog Koo, Cheonan-si (KR)

(73) Assignee: Semes Co., Ltd., Cheonan-si (KR)

( * ) Notice: Subject to any disclaimer, the term of this patent is extended or adjusted under 35 U.S.C. 154(b) by 303 days.

(21) Appl. No.: 12/211,234

(22) Filed: Sep. 16, 2008

(65) Prior Publication Data
US 2009/0071112 A1    Mar. 19, 2009

(30) Foreign Application Priority Data

Sep. 19, 2007  (KR) .................. 10-2007-0095160

(51) Int. Cl.
*B01D 46/00* (2006.01)
(52) U.S. Cl. ............... 55/385.1; 55/385.2; 55/385.6; 454/187; 414/217; 414/222.02; 414/416.08
(58) Field of Classification Search ............ 55/385.2, 55/385.6, 471, 473, DIG. 18, DIG. 29, DIG. 46; 454/187, 188, 189, 191, 184, 49, 57, 56, 454/229, 238; 156/345.32, 643, 657; 118/719, 118/731, 733; 414/217, 222.02, 416.08, 414/225
See application file for complete search history.

(56) References Cited

U.S. PATENT DOCUMENTS

| | | | | |
|---|---|---|---|---|
| 4,905,578 A | * | 3/1990 | Curtis et al. | 454/229 |
| 5,004,483 A | * | 4/1991 | Eller et al. | 95/10 |
| 5,009,685 A | * | 4/1991 | Wilson et al. | 55/385.2 |
| 5,064,457 A | * | 11/1991 | Weber | 55/385.2 |

(Continued)

FOREIGN PATENT DOCUMENTS

JP    2005-131566    4/2005

(Continued)

OTHER PUBLICATIONS

Office Action dated Nov. 27, 2008 from Korean Intellectual Property Office for Korean Patent Application No. 2007-95160.

*Primary Examiner* — Duane Smith
*Assistant Examiner* — Minh-Chau Pham
(74) *Attorney, Agent, or Firm* — Daly, Crowley, Mofford & Durkee, LLP (57) ABSTRACT

In an apparatus for transferring a substrate, a partition wall is disposed in a vertical direction in a housing to divide an interior space of the housing into a first space and a second space. A pressure generating member divides the first space into an upper space and a lower space and moves in a vertical direction in the first space such that a positive pressure and a negative pressure are alternately generated in the upper space and the lower space. A substrate supporting member is movably disposed in the second space to support and to transfer the substrate. A plurality of gates is disposed on a side wall of the housing and the partition wall, and is opened and closed by the positive pressure and the negative pressure such that the particles are eliminated from the second space to an exterior space via the first space.

17 Claims, 6 Drawing Sheets

U.S. PATENT DOCUMENTS

| | | | |
|---|---|---|---|
| 5,074,897 A * | 12/1991 | Sikich | 55/385.2 |
| 5,099,751 A * | 3/1992 | Newman et al. | 454/238 |
| 6,340,405 B2 * | 1/2002 | Park | 156/345.32 |
| 7,014,672 B2 * | 3/2006 | Ishihara et al. | 55/356 |
| 2003/0121417 A1 * | 7/2003 | Lederer et al. | 95/273 |
| 2007/0110548 A1 * | 5/2007 | Oyama et al. | 414/416.08 |
| 2007/0274811 A1 * | 11/2007 | Murata et al. | 414/217 |
| 2008/0019807 A1 * | 1/2008 | Suzuki et al. | 414/217 |
| 2009/0060691 A1 * | 3/2009 | Wakabayashi | 414/222.02 |

FOREIGN PATENT DOCUMENTS

| | | |
|---|---|---|
| KR | 102004004945 | 6/2004 |

\* cited by examiner

UNIT FOR ELIMINATING PARTICLES AND APPARATUS FOR TRANSFERRING A SUBSTRATE HAVING THE SAME

PRIORITY STATEMENT

This application claims priority under 35 U.S.C. §119 to Korean Patent Application No. 2007-95160, filed on Sep. 19, 2007 in the Korean Intellectual Property Office (KIPO), the contents of which are herein incorporated by reference in their entirety.

BACKGROUND

1. Field

The example embodiments generally relate to a unit for eliminating particles and an apparatus for transferring a substrate having the same. More particularly, the example embodiments relate to a unit for eliminating particles to reduce contamination of a substrate and an apparatus for transferring a substrate having the particle eliminating unit.

2. Description of the Related Art

Semiconductor devices are generally manufactured through a series of processes such as a fabrication process, an electrical die sorting (EDS) process and a packaging process. Various electrical circuits and devices are fabricated on a semiconductor substrate such as a silicon wafer in the fabrication process, and electrical characteristics of the electrical circuits are inspected and defective chips are detected in the semiconductor substrate in the EDS process. Then, the devices are individually separated from the semiconductor substrate and each device is sealed in an epoxy resin and packaged into an individual semiconductor device in the packaging process.

The fabrication process includes various unit processes, and apparatuses for performing the unit processes may be stacked in multiple stages. In such a case, semiconductor substrates may be transferred in a vertical direction by a substrate transfer mechanism.

The substrate transfer mechanism includes a support member for supporting the substrates and a driving section for moving the support member in the vertical direction. The driving section transmits a driving force to the support member to transfer the substrates, and the support member may be moved in the vertical direction by the driving force. However, particles may be generated from the driving section while transferring the substrates, which may contaminate the substrates.

SUMMARY

Example embodiments of the present invention provide a unit for eliminating particles and an apparatus for transferring a substrate having the particle eliminating unit.

A unit for eliminating particles according to an aspect of the present invention may include a housing, a partition wall disposed in a vertical direction in the housing to divide an interior space of the housing into a first space and a second space, a pressure generating member dividing the first space into an upper space and a lower space and being movable in a vertical direction in the first space such that a positive pressure and a negative pressure are alternately generated in the upper space and the lower space, and a plurality of gates disposed on a side wall of the housing and the partition wall, and opened and closed by the positive pressure and the negative pressure such that the particles are eliminated from the second space to an exterior space via the first space.

In accordance with some example embodiments of the present invention, a first gate and a second gate may be hinged to an upper portion and a lower portion of the side wall of the housing, respectively. Further, a third gate and a fourth gate may be hinged to an upper portion and a lower portion of the partition wall, respectively.

In accordance with some example embodiments of the present invention, the first and second gates may be opened outward from the housing, and the third and fourth gates may be opened inward of the upper and lower spaces, respectively.

In accordance with some example embodiments of the present invention, the particle eliminating unit may further include elastic members connected to the first, second, third and fourth gates to close the opened first, second, third and fourth gates, respectively.

In accordance with some example embodiments of the present invention, the first and third gates may be disposed over a top dead point of the pressure generating member, and the second and fourth gates may be disposed under a bottom dead point of the pressure generating member.

In accordance with some example embodiments of the present invention, the particle eliminating unit may further include a driving section for moving the pressure generating member.

In accordance with some example embodiments of the present invention, the particle eliminating unit may further include driving sections to open and to close the gates according to a pressure in the upper space and a pressure in the lower space.

A unit for eliminating particles according to another aspect of the present invention may include a housing, a partition wall disposed in a vertical direction in the housing to divide an interior space of the housing into a first space and a second space, a pressure generating member dividing the first space into an upper space and a lower space and being movable in a vertical direction in the first space such that a positive pressure and a negative pressure are alternately generated in the upper space and the lower space, and a plurality of gates disposed on a portion of a side wall of the housing and a portion of the partition wall that define any one of the upper and lower spaces, and opened and closed by the positive pressure and the negative pressure such that the particles are eliminated from the second space to an exterior space via the one space. Here, an opening may be formed through another portion of the side wall of the housing that defines another one of the upper and lower spaces such that the another space communicates with the exterior space.

An apparatus for transferring a substrate according to still another aspect of the present invention may include a housing, a partition wall disposed in a vertical direction in the housing to divide an interior space of the housing into a first space and a second space, a pressure generating member dividing the first space into an upper space and a lower space and being movable in a vertical direction in the first space such that a positive pressure and a negative pressure are alternately generated in the upper space and the lower space, a substrate supporting member movably disposed in the second space to support and to transfer the substrate, and a plurality of gates disposed on a side wall of the housing and the partition wall, and opened and closed by the positive pressure and the negative pressure such that the particles are eliminated from the second space to an exterior space via the first space.

In accordance with some example embodiments of the present invention, the substrate transfer apparatus may further include a driving section to move the pressure generating member and the substrate supporting member.

In accordance with some example embodiments of the present invention, the driving section may include pulleys disposed at upper and lower portions of the first space and upper and lower portions of the second space, and a belt connecting the pulleys with one another through the partition wall. Here, the pressure generating member and the substrate supporting member may be mounted on the belt and may be moved in the vertical direction by rotation of the belt.

In accordance with some example embodiments of the present invention, the substrate transfer apparatus may further include a first driving section for moving the substrate supporting member, and a second driving section for moving the pressure generating member.

In accordance with some example embodiments of the present invention, a first gate and a second gate may be hinged to an upper portion and a lower portion of the side wall of the housing, respectively. Further, a third gate and a fourth gate may be hinged to an upper portion and a lower portion of the partition wall, respectively.

In accordance with some example embodiments of the present invention, the first and second gates may be opened outward from the housing, and the third and fourth gates may be opened inward of the upper and lower spaces, respectively.

In accordance with some example embodiments of the present invention, the substrate transfer apparatus may further include elastic members connected to the first, second, third and fourth gates to close the opened first, second, third and fourth gates, respectively.

In accordance with some example embodiments of the present invention, the first and third gates may be disposed over a top dead point of the pressure generating member, and the second and fourth gates may be disposed under a bottom dead point of the pressure generating member.

In accordance with some example embodiments of the present invention, the substrate transfer apparatus may further include driving sections to open and to close the gates according to a pressure in the upper space and a pressure in the lower space.

In accordance with the example embodiments of the present invention as described above, particles generated in a housing may be eliminated by moving a pressure generating member upward or downward, and contamination of substrates due to the particles may thus be reduced in the housing.

BRIEF DESCRIPTION OF THE DRAWINGS

Example embodiments of the present invention will become readily apparent along with the following detailed description when considered in conjunction with the accompanying drawings, in which.

DESCRIPTION OF THE EMBODIMENTS

The present invention is described more fully hereinafter with reference to the accompanying drawings, in which example embodiments of the present invention are shown. The present invention may, however, be embodied in many different forms and should not be construed as limited to the example embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "lower," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example embodiments of the present invention are described herein with reference to cross-sectional illustrations that are schematic illustrations of idealized embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the present invention.

Figure 1:
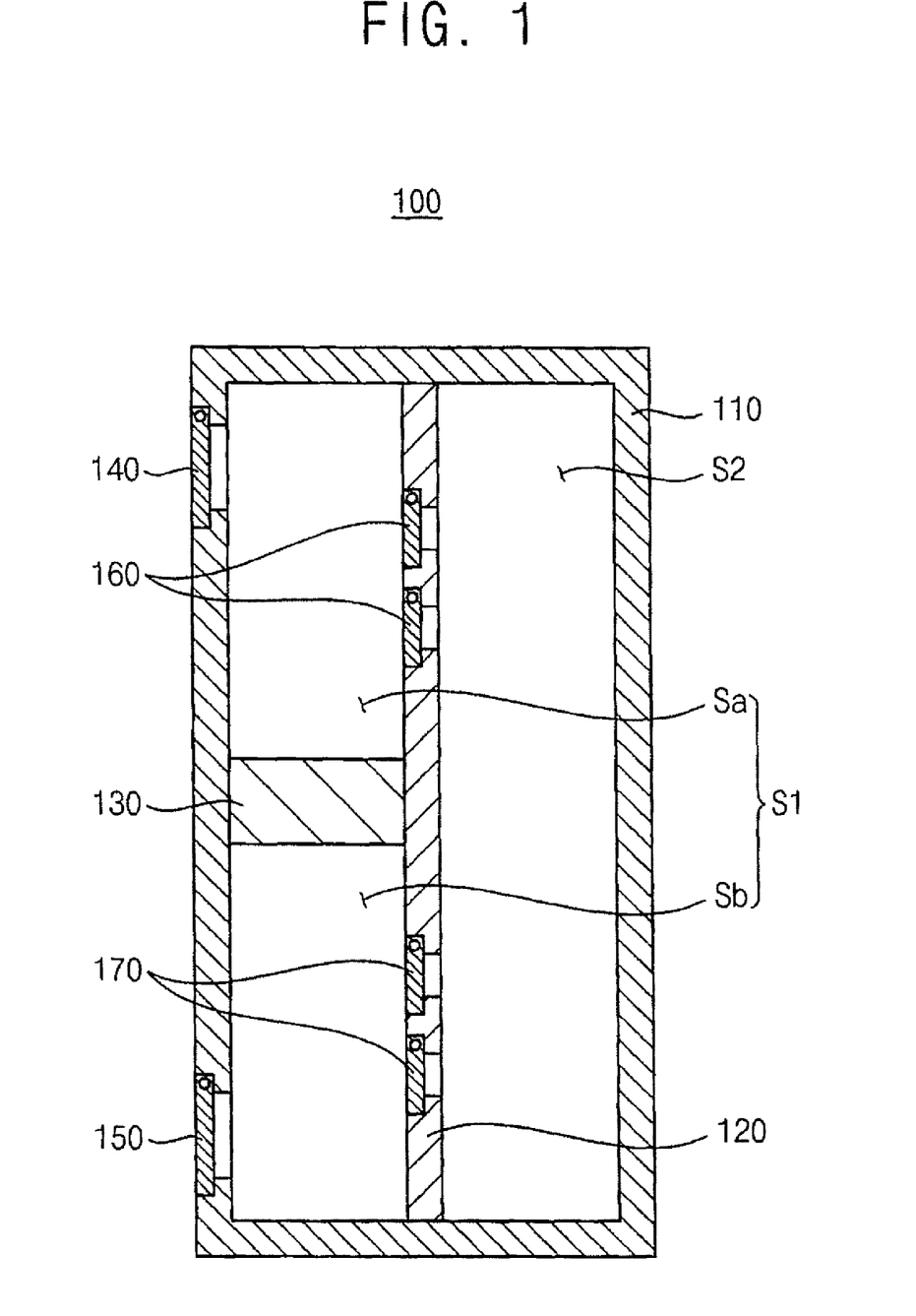
FIG. 1 is a cross-sectional view illustrating a unit for eliminating particles in accordance with an example embodiment of the present invention.

FIG. 1 is a cross-sectional view illustrating a unit for eliminating particles in accordance with an example embodiment of the present invention.

Referring to FIG. 1, a unit 100 for eliminating particles according to an example embodiment of the present invention may include a housing 110, a partition wall 120, a pressure generating member 130 and a plurality of gates. Particularly, the particle eliminating unit 100 may include a first gate 140, a second gate 150, a third gate 160 and a fourth gate 170.

The housing 110 may have an interior space and may extend in a vertical direction. For example, the housing 110 may have a hollow rectangular parallelepiped shape or a hollow cylindrical shape.

The partition wall 120 may be disposed in a vertical direction in the housing 110 and may divide the interior space of the housing 110 into a first space S1 and a second space S2. Various devices may be disposed in the second spaces S2. For example, mechanisms or robots may be disposed in the second spaces S2 to transfer semiconductor substrates such as silicon wafers. The first space S1 may be provided to eliminate particles from the second space S2. Thus, the first space S1 may be smaller than the second space S2.

The pressure generating member 130 may be disposed in the first space S1 and may divide the first space S1 into two spaces, e.g., an upper space Sa and a lower space Sb. The pressure generating member 130 may be moved by a driving section (not shown) in a vertical direction in the first space S1. Particularly, the pressure generating member 130 may be moved in the first space S1 in the vertical direction by the driving section such that a positive pressure and a negative pressure are alternately generated in the upper space Sa and the lower space Sb. For example, the driving section may be a hydraulic or pneumatic cylinder, a driving mechanism including a motor, a ball screw and a linear motion guide, or a driving mechanism including a motor, pulleys and a belt.

A pressure in the first space S1 may be varied by moving the pressure generating member 130 upward and downward. That is, the pressure generating member 130 may serve as a piston in the first space S1. In a case where the pressure generating member 130 is moved upward, a volume of the upper space Sa is decreased, and a volume of the lower space Sb is increased. Thus, a positive pressure is developed in the upper space Sa, and a negative pressure is developed in the lower space Sb. In a case where the pressure generating member 130 is moved downward, the volume of the upper space Sa is decreased, and the volume of the lower space Sb is increased. Thus, a negative pressure is developed in the upper space Sa, and a positive pressure is developed in the lower space Sb.

The first gate 140 may be disposed on an upper portion of the housing 110 that defines the first space S1. Particularly, the first gate 140 may be hinged to an upper portion of a side wall of the housing 110 and may be opened outward from the housing 110. The first gate 140 may allow the upper space Sa to communicate with an exterior space or to cut off from communication with the exterior space. For example, the first gate 140 may be opened by the positive pressure in the upper space Sa.

The first gate 140 may be closed by a first elastic member (not shown). That is, the first gate 140 may be connected to the upper portion of the side wall of the housing 110 by the first elastic member, and in a case where the pressure in the upper space Sa is decreased, the first gate 140 may be closed by the first elastic member. A spring may be used as the first elastic member. Alternatively, the first gate 140 may be opened or closed by a first driving section (not shown). The first driving section may open or close the first gate 140 according to the pressure in the upper space Sa.

The second gate 150 may be disposed on a lower portion of the housing 110 that defines the first space S1. Particularly, the second gate 150 may be hinged to a lower portion of the side wall of the housing 110 and may be opened outward from the housing 110. The second gate 150 may allow the lower space Sb to communicate with the exterior space or to cut off from communication with the exterior space. For example, the second gate 150 may be opened by the positive pressure in the lower space Sb.

The second gate 150 may be closed by a second elastic member (not shown). That is, the second gate 150 may be connected to the lower portion of the side wall of the housing 110 by the second elastic member, and in a case where the pressure in the lower space Sb is decreased, the second gate 150 may be closed by the second elastic member. A spring may be used as the second elastic member. Alternatively, the second gate 150 may be opened or closed by a second driving section (not shown). The second driving section may open or close the second gate 150 according to the pressure in the lower space Sb.

The third gate 160 may be disposed on an upper portion of the partition wall 120. Particularly, the third gate 160 may be hinged to an upper portion of the partition wall 120 and may be opened inward of the upper space Sa. The third gate 160 may allow the upper space Sa to communicate with the second space S2 or to cut off from communication with the second space S2. For example, the third gate 160 may be opened by the negative pressure in the upper space Sa.

The third gate 160 may be closed by a third elastic member (not shown). That is, the third gate 160 may be connected to the upper portion of the partition wall 120 by the third elastic member, and in a case where the pressure in the upper space Sa is increased, the third gate 160 may be closed by the third elastic member. A spring may be used as the third elastic member. Alternatively, the third gate 160 may be opened or closed by a third driving section (not shown). The third driving section may open or close the third gate 160 according to the pressure in the upper space Sa.

The fourth gate 170 may be disposed on a lower portion of the partition wall 120. Particularly, the fourth gate 170 may be hinged to a lower portion of the partition wall 120 and may be opened inward of the lower space Sb. The fourth gate 170 may allow the lower space Sb to communicate with the second space S2 or to cut off from communication with the second space S2. For example, the fourth gate 170 may be opened by the negative pressure in the lower space Sb.

The fourth gate 170 may be closed by a fourth elastic member (not shown). That is, the fourth gate 170 may be connected to the lower portion of the partition wall 120 by the fourth elastic member, and in a case where the pressure in the lower space Sb is increased, the fourth gate 170 may be closed by the fourth elastic member. A spring may be used as the fourth elastic member. Alternatively, the fourth gate 170 may be opened or closed by a fourth driving section (not shown).

The fourth driving section may open or close the fourth gate 170 according to the pressure in the lower space Sb.

In accordance with another example embodiment of the present invention, the first and third gates 140 and 160 may be removed from the unit 100. In such a case, an opening (not shown) may be formed through the upper portion of the side wall of the housing 110 to allow the upper space Sa to communicate with the exterior space. Alternatively, the second and fourth gates 150 and 170 may be removed from the unit 100. In such a case, an opening (not shown) may be formed through the lower portion of the side wall of the housing 110 to allow the lower space Sb to communicate with the exterior space.

Figure 2:
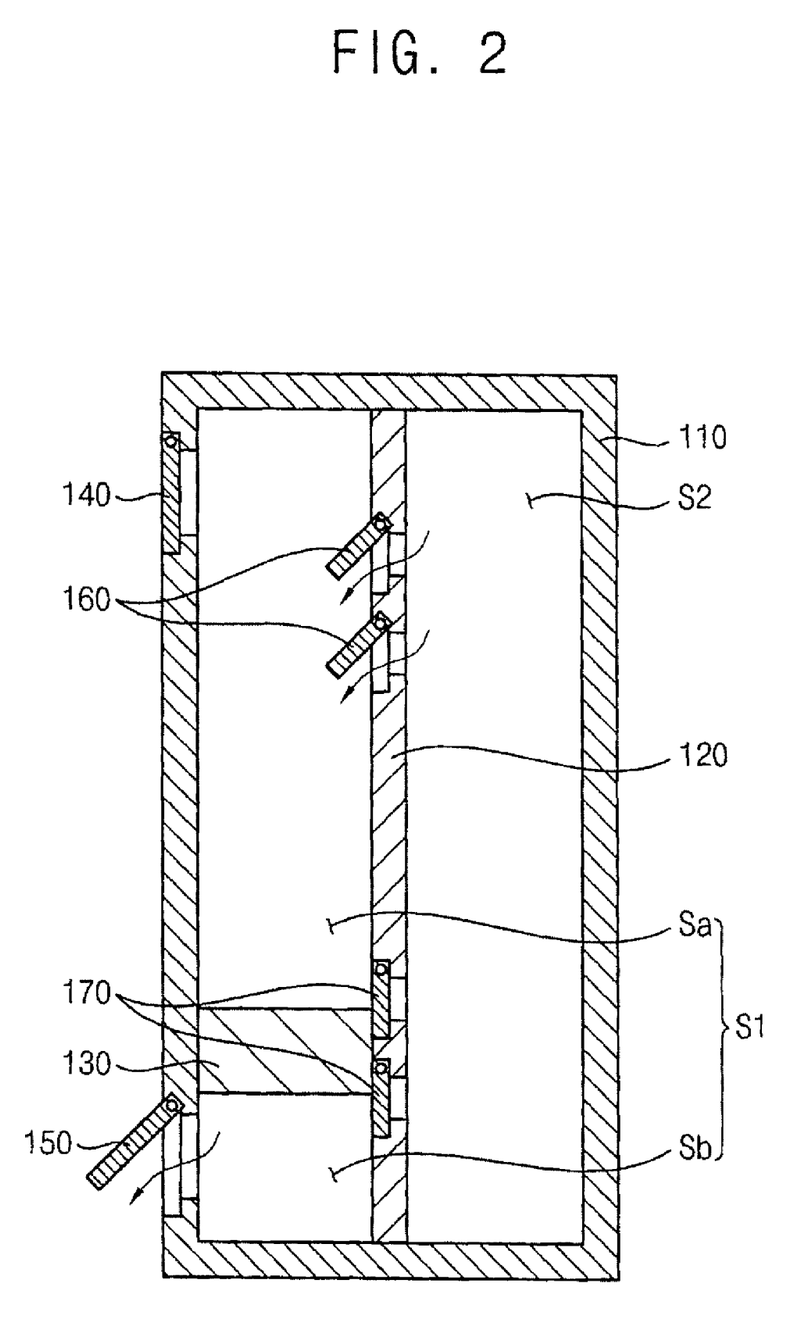
FIGS. 2 and 3 are cross-sectional views illustrating a method of eliminating particles using the particle eliminating unit shown in FIG. 1.
Figure 3:
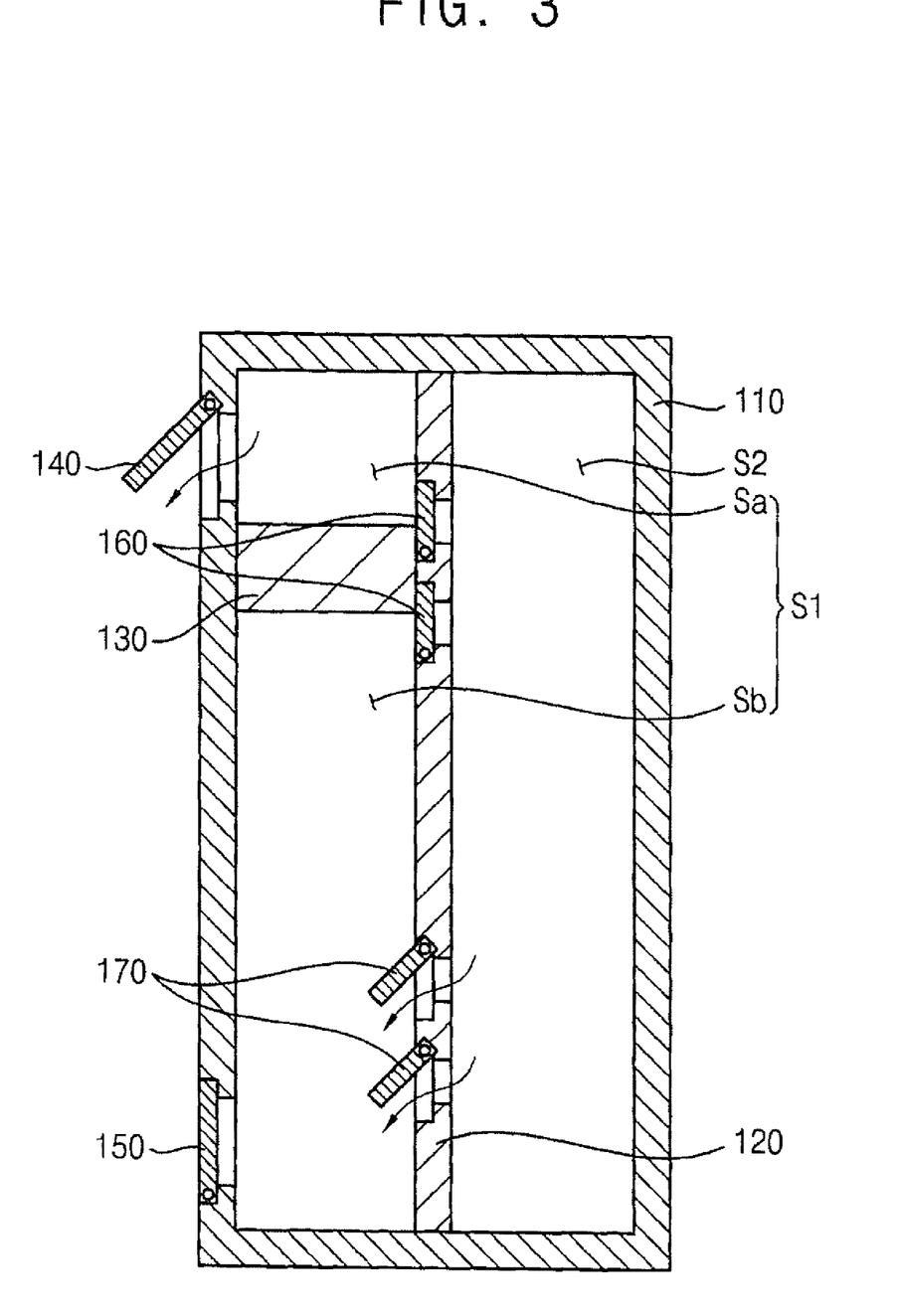

FIGS. 2 and 3 are cross-sectional views illustrating a method of eliminating particles using the particle eliminating unit 100 shown in FIG. 1.

Referring to FIG. 2, when the pressure generating member 130 is moved downward, a negative pressure may be developed in the upper space Sa, and a positive pressure may be developed in the lower space Sb. The third gate 160 may be opened by the negative pressure in the upper space Sa, and a first air current may be generated through the opened third gate 160 from the second space S2 into the upper space Sa because the pressure in the upper space Sa is lower than that in the second space S2. Thus, particles may be moved along the first air current from the second space S2 into the upper space Sa. Meanwhile, when the pressure in the upper space Sa becomes equal to that in the second space S2 due to the first air current, the third gate 160 may be closed by the third elastic member.

The second gate 150 may be opened by the positive pressure in the lower space Sb, and a second air current may be generated through the opened second gate 150 from the lower space Sb into the exterior space because the pressure in the lower space Sb is higher than that of the exterior space. Thus, particles in the lower space Sb may be eliminated along the second air current into the exterior space. Meanwhile, when the pressure in the lower space Sb becomes equal to that of the exterior space due to the second air current, the second gate 150 may be closed by the second elastic member.

Referring to FIG. 3, when the pressure generating member 130 is moved upward, a positive pressure may be developed in the upper space Sa, and a negative pressure may be developed in the lower space Sb. The first gate 140 may be opened by the positive pressure in the upper space Sa, and a third air current may be generated through the opened first gate 140 from the upper space Sa into the exterior space because the pressure in the upper space Sa is higher than that of the exterior space. Thus, particles in the upper space Sa may be eliminated along the third air current into the exterior space. Meanwhile, when the pressure in the upper space Sa becomes equal to that of the exterior space due to the third air current, the first gate 140 may be closed by the first elastic member.

The fourth gate 170 may be opened by the negative pressure in the lower space Sb, and a fourth air current may be generated through the opened fourth gate 170 from the second space S2 into the lower space Sb because the pressure in the lower space Sb is lower than that in the second space S2. Thus, particles may be moved along the fourth air current from the second space S2 into the lower space Sb. Meanwhile, when the pressure in the lower space Sb becomes equal to that in the second space S2 due to the fourth air current, the fourth gate 170 may be closed by the fourth elastic member.

As described above, the particles in the second space S2 may be moved into the upper space Sa through the third gate 160 by moving the pressure generating member 130 downward and may then be eliminated from the upper space Sa through the first gate 140 by moving the pressure generating member 130 upward. Further, the particles in the second space S2 may be moved into the lower space Sb through the fourth gate 170 by moving the pressure generating member 130 upward and may then be eliminated from the lower space Sb through the second gate 150 by moving the pressure generating member 130 upward. As a result, the particles in the second space S2 may be easily eliminated via the first space S1 into the exterior space.

The pressure generating member 130 may be moved in the vertical direction between the first and second gates 140 and 150, and may further be moved in the vertical direction between the third and fourth gates 160 and 170. That is, the first and third gates 140 and 160 may be disposed over a top dead point of the pressure generating member 130, and the second and fourth gates 150 and 170 may be disposed under a bottom dead point of the pressure generating member 130.

Figure 4:
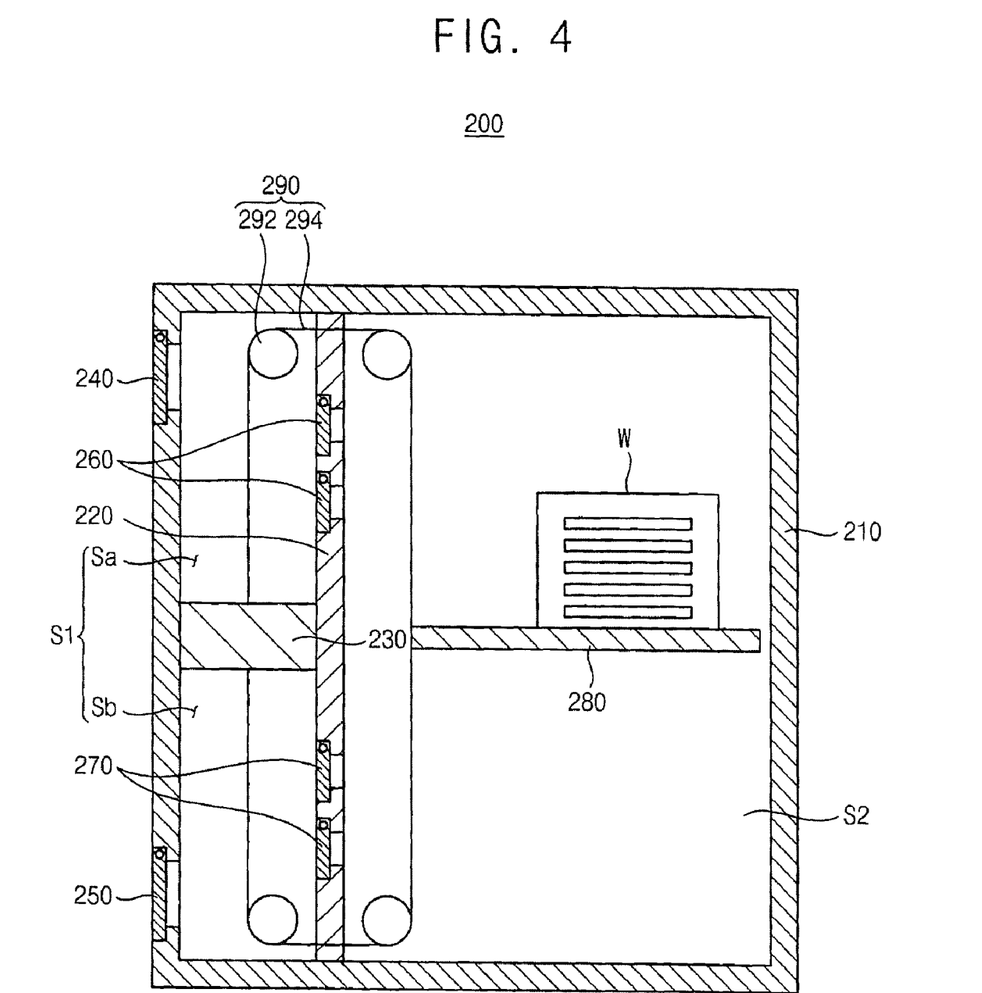
FIG. 4 is a cross-sectional view illustrating a substrate transfer apparatus in accordance with another example embodiment of the present invention.

FIG. 4 is a cross-sectional view illustrating a substrate transfer apparatus in accordance with another example embodiment of the present invention.

Referring to FIG. 4, a substrate transfer apparatus 200 may include a housing 210, a partition wall 220, a pressure generating member 230, a first gate 240, a second gate 250, a third gate 260, a fourth gate 270, a substrate supporting member 280 and a driving section 290.

Further detailed descriptions for the housing 210, the partition wall 220, the pressure generating member 230, the first gate 240, the second gate 250, the third gate 260 and the fourth gate 270 will be omitted since these elements are similar to those of the particle eliminating unit 100 already described with reference to FIGS. 1 to 3.

The substrate supporting member 280 may have a plate-like shape and may be disposed in a second space S2 of the housing 210. The substrate supporting member 280 may support substrates W such as silicon wafers or glass substrates, or a cassette in which the substrates W are received. The substrate supporting member 280 may move in a vertical direction to transfer the substrates W in the second space S2.

The driving section 290 may move the pressure generating member 230 and the substrate supporting member 280 upward and downward. In accordance with still another example embodiment of the present invention, the substrate transfer apparatus 200 may further include a second driving section (not shown) to move the pressure generating member 230 upward and downward.

The pressure generating member 230 and the substrate supporting member 280 may be moved in directions opposite to each other by the driving section 290. As shown in FIG. 4, the driving section 290 may include a plurality of pulleys 292 and a belt 294. For example, four pulleys 292 may be disposed at an upper portion of an upper space Sa, a lower portion of a lower space Sb, and upper and lower portions of the second space S2, respectively. The pulleys 292 may be connected with one another by the belt 294. The driving section 290 may further include a motor (not shown) connected with any one of the pulleys 292.

The partition wall may have passageways (not shown) to pass the belt 294 therethrough. The pressure generating member 230 and the substrate supporting member 280 may be mounted on the belt 294. Thus, when the belt 294 rotates in a counterclockwise direction, the substrate supporting member 280 is moved upward, and the pressure generating member 230 is moved downward. On the contrary, when the belt 294 rotates in a clockwise direction, the substrate supporting member 280 is moved downward, and the pressure generating member 230 is moved upward.

In accordance with still another example embodiment of the present invention, the pressure generating member 230 may be moved by the second driving section without regard to the substrate supporting member 280. For example, the second driving section may be a hydraulic or pneumatic cylinder, a driving mechanism including a motor, a ball screw and a linear motion guide, or a driving mechanism including a motor, pulleys and a belt.

In accordance with still another example embodiment of the present invention, the first and third gates 240 and 260 may be removed from the housing 210. In such a case, an opening (not shown) may be formed through the upper portion of the side wall of the housing 210 to allow the upper space Sa to communicate with the exterior space. Alternatively, the second and fourth gates 250 and 270 may be removed from the housing 210. In such a case, an opening (not shown) may be formed through the lower portion of the side wall of the housing 210 to allow the lower space Sb to communicate with the exterior space.

Figure 5:
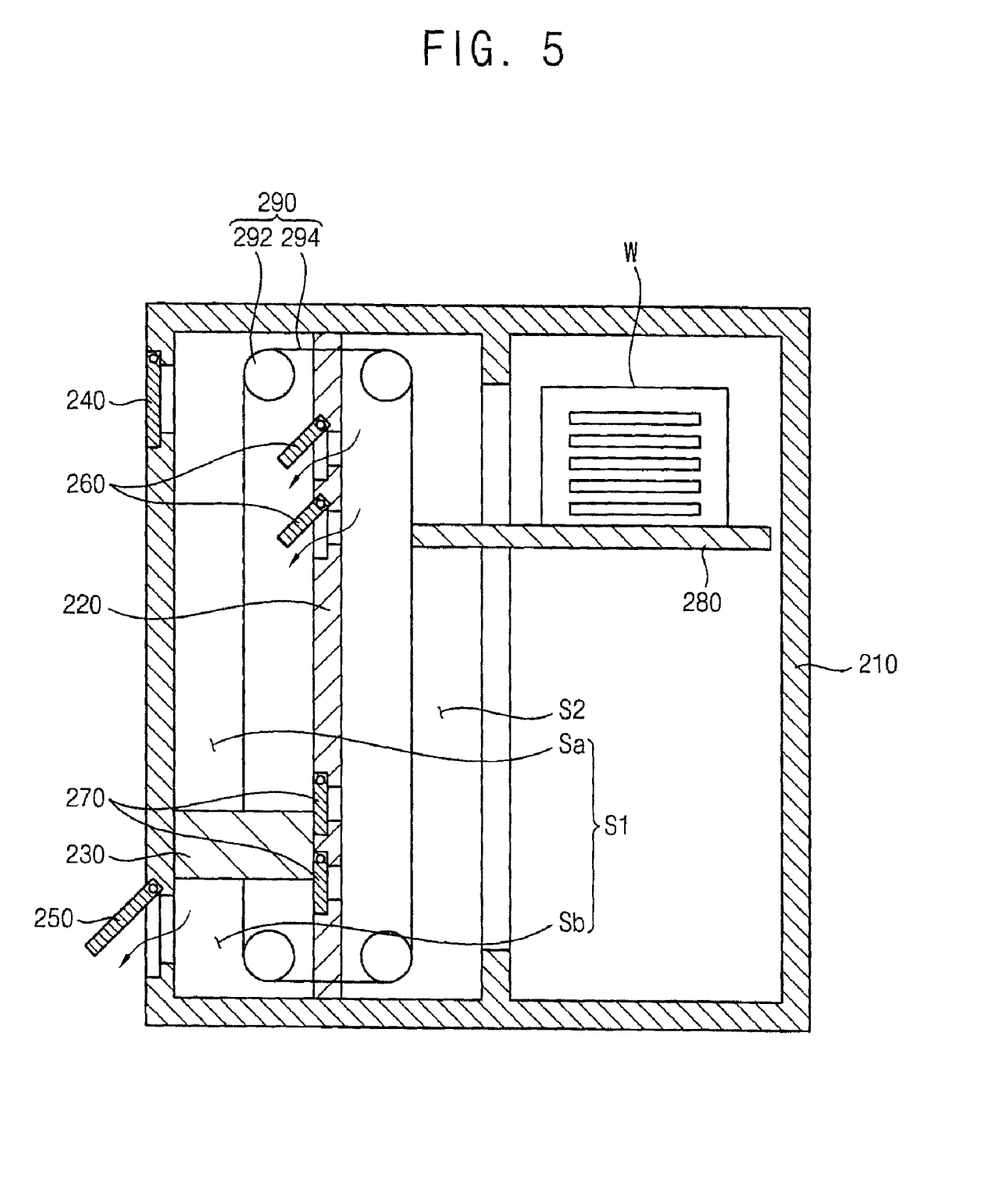
FIGS. 5 and 6 are cross-sectional views illustrating a method of transferring substrates using the substrate transfer apparatus shown in FIG. 4.
Figure 6:
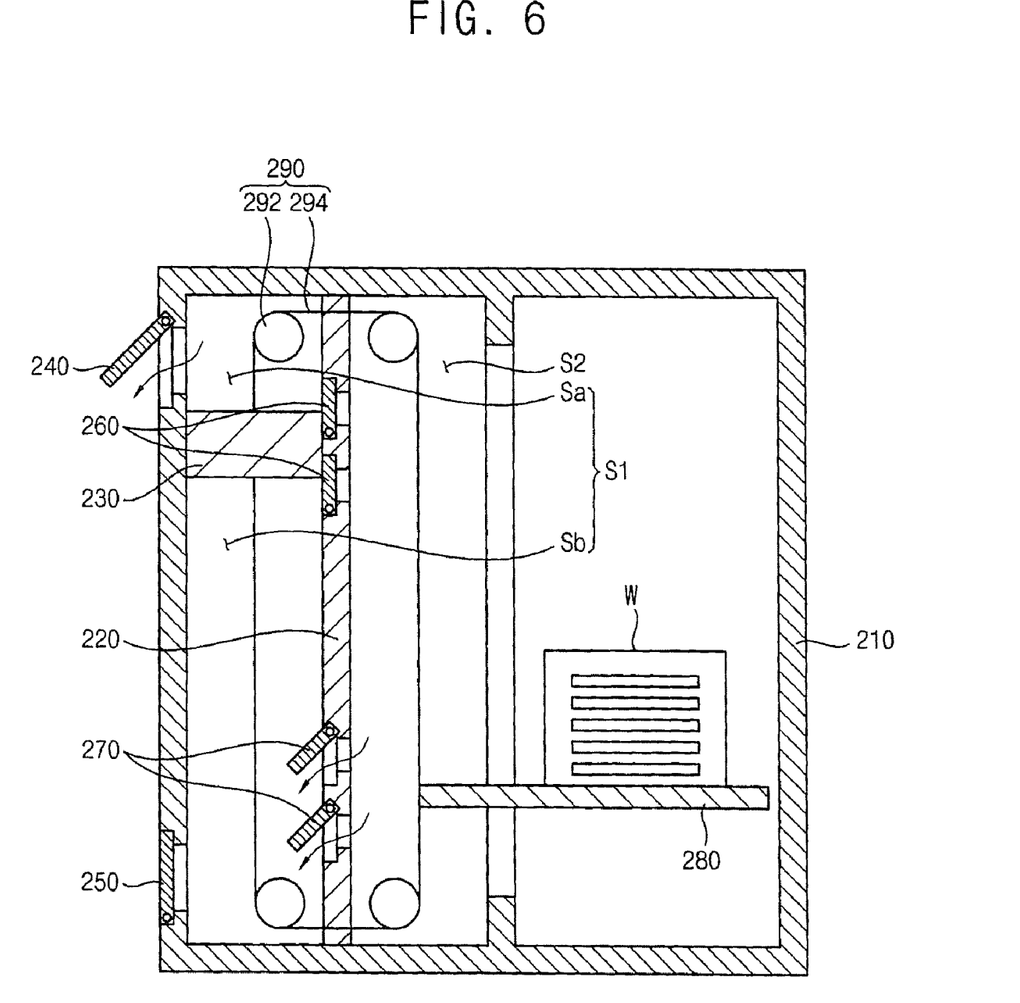

FIGS. 5 and 6 are cross-sectional views illustrating a method of transferring substrates using the substrate transfer apparatus 200 shown in FIG. 4.

Referring to FIG. 5, when the belt 294 rotates in the counterclockwise direction, the substrate supporting member 280 may be moved upward to thereby transfer the substrates upward. While the substrate supporting member 280 is moved upward, the pressure generating member 230 may be moved downward.

When the pressure generating member 230 is moved downward, the second and third gates 250 and 260 are opened. A first air current may be generated through the opened third gate 260 from the second space S2 into the upper space Sa. Thus, particles, which may be generated from the substrate supporting member 280 and the driving section 290, may be moved along the first air current from the second space S2 into the upper space Sa. Meanwhile, when the pressure in the upper space Sa becomes equal to that in the second space S2 due to the first air current, the third gate 260 may be closed by a third elastic member.

Further, a second air current may be generated through the opened second gate 250 from the lower space Sb into an exterior space. Thus, particles in the lower space Sb may be eliminated along the second air current into the exterior space. Meanwhile, when the pressure in the lower space Sb becomes equal to that of the exterior space due to the second air current, the second gate 250 may be closed by a second elastic member.

Referring to FIG. 6, when the belt 294 rotates in the clockwise direction, the substrate supporting member 280 may be moved downward to thereby transfer the substrates downward. While the substrate supporting member 280 is moved downward, the pressure generating member 230 may be moved upward.

When the pressure generating member 230 is moved upward, the first and fourth gates 240 and 270 are opened. A third air current may be generated through the opened first gate 240 from the upper space Sa into the exterior space. Thus, particles in the upper space Sa may be eliminated along the third air current into the exterior space. Meanwhile, when the pressure in the upper space Sa becomes equal to that of the exterior space due to the third air current, the first gate 240 may be closed by a first elastic member.

A fourth air current may be generated through the opened fourth gate 270 from the second space S2 into the lower space Sb. Thus, particles generated in the second space S2 may be moved along the fourth air current from the second space S2 into the lower space Sb. Meanwhile, when the pressure in the lower space Sb becomes equal to that in the second space S2 due to the fourth air current, the fourth gate 270 may be closed by a fourth elastic member.

As described above, the particles in the second space S2 may be moved into the upper space Sa through the third gate 260 by moving the pressure generating member 230 downward and may then be eliminated from the upper space Sa through the first gate 240 by moving the pressure generating member 230 upward. Further, the particles in the second space S2 may be moved into the lower space Sb through the fourth gate 270 by moving the pressure generating member 230 upward and may then be eliminated from the lower space Sb through the second gate 250 by moving the pressure generating member 230 downward. As a result, the particles in the second space S2 may be easily eliminated via the first space S1 into the exterior space, and contamination of the substrates may be reduced in the second space S2.

In accordance with the example embodiments of the present invention as described above, particles generated in a housing may be eliminated by moving a pressure generating member upward or downward, and contamination of substrates due to the particles may thus be reduced in the housing.

Although the example embodiments of the present invention have been described, it is understood that the present invention should not be limited to these example embodiments but various changes and modifications can be made by those skilled in the art within the spirit and scope of the present invention as hereinafter claimed.

What is claimed is:

1. A unit for eliminating particles, the unit comprising:
   a housing;
   a partition wall disposed in a vertical direction in the housing to divide an interior space of the housing into a first space and a second space;
   a pressure generating member dividing the first space into an upper space and a lower space and being movable in a vertical direction in the first space such that a positive pressure and a negative pressure are alternately generated in the upper space and the lower space; and
   a plurality of gates disposed on a side wall of the housing and the partition wall, and opened and closed by the positive pressure and the negative pressure such that the particles are eliminated from the second space to an exterior space via the first space.

2. The unit of claim 1, wherein a first gate and a second gate are hinged to an upper portion and a lower portion of the side wall of the housing, respectively, and a third gate and a fourth gate are hinged to an upper portion and a lower portion of the partition wall, respectively.

3. The unit of claim 2, wherein the first and second gates are opened outward from the housing, and the third and fourth gates are opened inward of the upper and lower spaces, respectively.

4. The unit of claim 3, further comprising elastic members connected to the first, second, third and fourth gates to close the opened first, second, third and fourth gates, respectively.

5. The unit of claim 2, wherein the first and third gates are disposed over a top dead point of the pressure generating member, and the second and fourth gates are disposed under a bottom dead point of the pressure generating member.

6. The unit of claim 1, further comprising a driving section moving the pressure generating member.

7. The unit of claim 1, further comprising driving sections opening and closing the gates according to a pressure in the upper space and a pressure in the lower space.

8. A unit for eliminating particles, the unit comprising:
   a housing;

a partition wall disposed in a vertical direction in the housing to divide an interior space of the housing into a first space and a second space;

a pressure generating member dividing the first space into an upper space and a lower space and being movable in a vertical direction in the first space such that a positive pressure and a negative pressure are alternately generated in the upper space and the lower space; and a plurality of gates disposed on a portion of a side wall of the housing and a portion of the partition wall that define any one of the upper and lower spaces, and opened and closed by the positive pressure and the negative pressure such that the particles are eliminated from the second space to an exterior space via the one space, wherein an opening is formed through another portion of the side wall of the housing that defines another one of the upper and lower spaces such that the another space communicates with the exterior space.

9. An apparatus for transferring a substrate, the apparatus comprising:

a housing;

a partition wall disposed in a vertical direction in the housing to divide an interior space of the housing into a first space and a second space;

a pressure generating member dividing the first space into an upper space and a lower space and being movable in a vertical direction in the first space such that a positive pressure and a negative pressure are alternately generated in the upper space and the lower space;

a substrate supporting member movably disposed in the second space to support and to transfer the substrate; and a plurality of gates disposed on a side wall of the housing and the partition wall, and opened and closed by the positive pressure and the negative pressure such that the particles are eliminated from the second space to an exterior space via the first space.

10. The apparatus of claim 9, further comprising a driving section moving the pressure generating member and the substrate supporting member.

11. The apparatus of claim 9, wherein the driving section comprises:

pulleys disposed at an upper portion and a lower portion of the first space and an upper portion and a lower portion of the second space; and a belt connecting the pulleys with one another through the partition wall, wherein the pressure generating member and the substrate supporting member are mounted on the belt and moved in the vertical direction by rotation of the belt.

12. The apparatus of claim 9, further comprising:

a first driving section moving the substrate supporting member; and a second driving section moving the pressure generating member.

13. The apparatus of claim 9, wherein a first gate and a second gate are hinged to an upper portion and a lower portion of the side wall of the housing, respectively, and a third gate and a fourth gate are hinged to an upper portion and a lower portion of the partition wall, respectively.

14. The apparatus of claim 13, wherein the first and second gates are opened outward from the housing, and the third and fourth gates are opened inward of the upper and lower spaces, respectively.

15. The apparatus of claim 14, further comprising elastic members connected to the first, second, third and fourth gates to close the opened first, second, third and fourth gates, respectively.

16. The apparatus of claim 13, wherein the first and third gates are disposed over a top dead point of the pressure generating member, and the second and fourth gates are disposed under a bottom dead point of the pressure generating member.

17. The apparatus of claim 9, further comprising driving sections opening and closing the gates according to a pressure in the upper space and a pressure in the lower space.

* * * * *